United States Patent
Tudhope et al.

(10) Patent No.: US 7,608,151 B2
(45) Date of Patent: Oct. 27, 2009

(54) METHOD AND SYSTEM FOR COATING SECTIONS OF INTERNAL SURFACES

(75) Inventors: Andrew William Tudhope, Danville, CA (US); William John Boardman, Colorado Springs, CO (US); Raul Donate Mercado, Danville, CA (US); Frederick Contreras, Livermore, CA (US)

(73) Assignee: Sub-One Technology, Inc., Pleasanton, CA (US)

(*) Notice: Subject to any disclaimer, the term of this patent is extended or adjusted under 35 U.S.C. 154(b) by 514 days.

(21) Appl. No.: 11/074,906

(22) Filed: Mar. 7, 2005

(65) Prior Publication Data

US 2006/0196419 A1    Sep. 7, 2006

(51) Int. Cl.
*H01L 21/00* (2006.01)
*C23C 14/00* (2006.01)
*C23C 16/00* (2006.01)

(52) U.S. Cl. .................. 118/715; 118/723 R; 118/50.1; 427/523; 427/524; 427/56

(58) Field of Classification Search ................. 118/715, 118/720, 723 R, 50.1; 427/248.1, 523, 524, 427/569; 156/345; 315/111
See application file for complete search history.

(56) References Cited

U.S. PATENT DOCUMENTS

| | | | | |
|---|---|---|---|---|
| 4,407,712 A | * | 10/1983 | Henshaw et al. | 204/298.05 |
| 4,417,911 A | | 11/1983 | Cundy et al. | |
| 4,464,223 A | * | 8/1984 | Gorin | 438/729 |
| 4,714,589 A | | 12/1987 | Auwerda et al. | 427/39 |
| 4,877,642 A | * | 10/1989 | Gartner et al. | 427/575 |
| 5,026,466 A | | 6/1991 | Wesemeyer et al. | 204/192.38 |
| 6,129,856 A | | 10/2000 | Jung et al. | |
| 6,182,604 B1 | * | 2/2001 | Goeckner et al. | 204/298.05 |
| 6,467,425 B1 | * | 10/2002 | Neff et al. | 118/723 VE |
| 6,699,324 B1 | | 3/2004 | Berdin et al. | 118/306 |
| 7,300,684 B2 | * | 11/2007 | Boardman et al. | 427/249.7 |
| 2006/0121704 A1 | * | 6/2006 | Walther et al. | 438/510 |

FOREIGN PATENT DOCUMENTS

| | | | |
|---|---|---|---|
| EP | 1 094 128 | | 4/2001 |
| EP | 1094128 | | 4/2001 |
| FR | 1534833 | * | 6/1978 |
| GB | 1341759 | * | 12/1973 |
| GB | 2030180 A | * | 4/1980 |
| GB | 2 079 742 | | 1/1982 |
| JP | 61-79774 | | 4/1986 |
| JP | 62-170467 | * | 7/1987 |

* cited by examiner

*Primary Examiner*—Ram N. Kackar
(74) *Attorney, Agent, or Firm*—Schneck & Schneck; Terry McHugh

(57) ABSTRACT

A method and system for coating the internal surfaces of a localized area or section of a workpiece is presented. Conductive structures are inserted into one or more openings of a workpiece to define the section to be coated. In some embodiments, a bias voltage is connected to a workpiece section, which functions as a cathode. A gas source and vacuum source are coupled to each conductive structure through a flow control system. The flow control system enables a first opening to function as a gas inlet and a second opening to function as a vacuum exhaust. Only the section encompassed by the conductive structures is coated. When the coating process is completed, a means for varying the conductive structures along the length is utilized to move onto the next section to be coated.

16 Claims, 6 Drawing Sheets

METHOD AND SYSTEM FOR COATING SECTIONS OF INTERNAL SURFACES

TECHNICAL FIELD

The invention relates generally to deposition systems and more specifically to methods and systems for coating pipes that are very long in length.

BACKGROUND ART

The corrosion of industrial piping and other components such as valves and pumps is a major problem in some industries. The oil industry, in particular, faces severely corrosive environments, with corrosive gasses and liquids such as $H_2S$ (hydrogen sulfide) at elevated temperatures and pressures. Additionally, these conditions form severe wear and erosion environments. One solution to these issues is to coat a lower grade base material with a high quality coating material having the desired high corrosion and wear-resistant properties. Typically, these types of properties will be found in metal, ceramic and particularly diamond-like carbon coatings.

Expensive specialty alloys, such as Hastelloy and Inconel (both of which are federally registered trademarks of Huntington Alloys Corporation), are commonly used for exhaust piping in the chemical processing industries. These alloys exhibit high temperature strength and corrosion resistance. Again, a less expensive base material can be used if a suitable surface coating is applied to the interior surface that is to be exposed to the corrosive environment.

Prior art coating methods include chemical vapor deposition (CVD), physical vapor deposition (PVD), plasma spray, electroplating and sol-gel. Of these methods, CVD and PVD provide the highest quality films with regard to purity, adhesion, uniformity and other properties. Both of these techniques require the use of a specialized vacuum chamber, making it difficult to coat fully assembled components. In the case of applications using piping, valves, pumps or tubing for carrying corrosive material, such as the oil/petrochemical industry, the interior surface that is in contact with the corrosive material must be coated. For very low pressure techniques such as PVD, where the pressure is below or near the molecular flow region, coating interior surfaces has been limited to only large diameter and short length (small aspect ratio) tubes. Similarly, CVD techniques are limited to such applications, due to the need to supply heat for the chemical reaction, which can damage heat-sensitive substrates. Plasma enhanced CVD (PECVD) can be used to lower the temperature required for reaction, but there is then difficulty in maintaining uniform plasma inside the pipe and in preventing depletion of source gas as it flows down the pipe.

The plasma immersion ion implantation and deposition (PIIID) technique has been shown to be useful for coating the external surfaces of complex shapes. PIIID is performed by applying a negative bias to the workpiece, which will pull positive ions toward the workpiece, if the plasma sheath is conformal. There are also improvements that can be made to film properties such as adhesion and film density via ion bombardment of the workpiece.

In prior art PVD or CVD chambers, the chamber dimensions are designed such that there is very little change in pressure throughout the chamber. When using a workpiece as a chamber, one has no control over the shape of the chamber/workpiece and so the process must be designed to account for workpieces with high aspect ratios (length/diameter) in which there is a significant pressure drop from the gas inlet to the exit. This invention provides a method of coating such workpieces with good uniformity. Also it may be desirable to coat the internal surfaces of sections of pipe and then assemble the sections by welding. In this case, it is necessary to coat the welded areas of a large length of pipe. The invention provides this ability.

Methods of coating the interior surface of tubes have been described whereby the source material to be applied is inserted into the tube and then sputtered or arced off onto the tube. For example, U.S. Pat. No. 5,026,466 to Wesemeyer et al. describes a method of inserting a cathode into a tube and arcing the cathodic material onto the inside of the tube. U.S. Pat. No. 4,407,712 to Henshaw et al. describes a hollow cathode with a high evaporation temperature metal source inserted into a tube, with a cathode arc removing the source material from the hollow cathode and coating the inside surface of the tube. This type of arrangement has several drawbacks, including being limited to only large diameter tubes (due to having to insert the hollow cathode tube with associated heat shield and cooling tubes into the tube to be coated), the requirement of complicated arrangements for motion of anode and hollow cathode through the tube, and the generation of macro-particles by cathodic arc. U.S. Pat. No. 4,714,589 to Auwerda et al. describes coating the inside of a tube by plasma activated deposition of a gas mixture, but this method is limited to electrically insulative tubes and coatings, and involves a complicated system for moving a microwave source along the outside of the tube.

In situations in which welded areas or sections of pipe require coating, methods for doing so typically involve an apparatus or structure inserted into the pipe. The structure is then drawn along the pipe to coat a large area or is positioned at the welded area to be coated. For example, U.S. Pat. No. 6,699,324 to Berdin et al. describes a method or vehicle which can travel in a pipe and be pulled along a length of the pipe in a manner which allows a rotating distributor to evenly coat the inner walls of the pipe. While this method works well, other improvements are available to uniformly coat welded areas or sections of a pipe.

SUMMARY OF THE INVENTION

A method in accordance with the present invention allows uniform coating of internal surfaces of a long pipe, tube or other workpiece by isolating smaller sections of the pipe and then using the pipe section itself as a deposition chamber. The method includes isolating the section of pipe to be coated by inserting solid plates through the openings of the workpiece and locating them at each end of the section to be coated, coupling a first plate of the pipe section to a gas supply subsystem to function as an entrance, and coupling a second plate of the pipe to a pumping subsystem to function as the exit. Gas is flowed through the pipe section from the first isolating plate (entrance) to the second isolating plate (exit). This source gas can be activated to coat the surface of the workpiece by either thermal or plasma methods or a combination of the two. Using thermal methods, the workpiece can be placed in a heated oven or it can be wrapped in an insulating blanket with a heating coil without the need for a furnace. Thermal techniques can only be used for substrates that are not heat sensitive. For heat-sensitive workpieces, some amount of plasma activation or PECVD must be used to lower the required activation temperature.

In the case of PECVD, the isolating plates also act as electrodes. The isolating plates are provided with a mechanism for movement within the longer workpiece, so that the method can be used to coat a very long workpiece by moving from section to section or it can be used for coating welded areas. In some embodiments, the method and the system for implementing the method are used to provide sectional coating for a workpiece with more than two openings. On the other hand, the sectional coating method may be applied to workpieces with a single opening, if the gas subsystem and pumping subsystem are both connected to a structure that is inserted into the opening of the workpiece.

This invention can also be used to modify surface or subsurface properties, such as nitriding of steel or argon sputter cleaning of surfaces. This technique can be used not only for chemical vapor deposition processes (e.g. when a precursor gas or ionized gas reacts chemically at the surface) but also for techniques that would be classified as physical vapor deposition (i.e. the workpiece is bombarded by ions that react physically (e.g. ion implantation, rather than chemically, to form a coating or subsurface modification), or combinations of these techniques. Because of its wider applicability and greater complexity the description of the different embodiments of the invention will focus on plasma methods, but the invention also applies to the simpler thermal methods of deposition or surface treatment.

For the PECVD application of the sectional coating process, the gas flow and the pumping speed preferably are adjusted such that the pressure provides a hollow cathode environment in the workpiece upon application of a voltage bias. This pressure is such that the electron mean free path is slightly less than the diameter of the tube, causing electrons to oscillate across the tube and resulting in multiple ionizing collisions and a more intense plasma. This provides an improvement relative to prior art PECVD approaches in which plasma is generated externally from a workpiece, resulting in a loss of ionization as gas flows through the tube, so that less film deposition occurs toward the exit from the workpiece. In comparison, as a consequence of the hollow cathode generated throughout the pipe section, the invention achieves a more uniformly ionized plasma along the length of the section, thereby providing a more uniform deposition.

The sectional coating method provides an improvement relative to prior art CVD approaches in which precursor gas is flowed from the entrance of a high aspect ratio workpiece to the exit, resulting in a loss of precursor gas concentration as the gas flows through the tube. Using these prior art approaches, the gas reacts initially at the entrance, leaving a smaller concentration of precursor gas toward the exit. By-product gas species can also be formed, further diluting the reactant gas, so that less film deposition occurs toward the exit from the workpiece. This is commonly referred to as "depletion" of the precursor gas. This depletion problem will become more severe for long lengths and small diameters. In comparison, as a consequence of the sectional coating, the invention eliminates depletion by enabling the coating of smaller sectional lengths, thereby providing a more uniform deposition.

The method allows coating of interior surfaces of pipes, tubes, valves, pumps or other workpieces with more complex geometries. The sectional coating significantly reduces the possibility of an end-to-end decline in coating thickness as a consequence of a gradual reduction of the density of coating material in the plasma as the coating material is drawn from the plasma to the internal surface or surfaces of the workpiece.

In accordance with one embodiment of the invention, a traditional DC or AC plasma is generated to form the coating. A first conductive plate is inserted through an opening of the workpiece to the "front" of the section to be coated. This plate is coupled to a gas source to function as the entrance, while a second isolating plate is inserted through a second opening of the workpiece and is coupled to a vacuum source to function as the exit. A retractable insulating seal is extended to provide a vacuum-tight seal and electrical isolation between the workpiece and the plates. A biasing system is connected between the conductive plates and either a DC or AC voltage bias is applied. In this configuration, the conductive plates are biased but the workpiece is not. A gas containing the coating material is flowed through the workpiece section from the entrance to the exit, so as to implement the coating of the workpiece section. When the coating process is completed, the interior of the workpiece section is brought to atmosphere, the vacuum seals are retracted, and the plates are moved to the next section or weld area to be coated.

In other embodiments of the invention, the workpiece is biased as a cathode and the conductive plates are biased as anodes. As previously described, the conductive plates are inserted into openings of the workpiece, the vacuum seal is extended, and a biasing system is connected. In this situation, the biasing system applies a negative DC voltage bias to the workpiece (cathode) with respect to the conductive plates (anodes).

In other embodiments, the plates are not conductive, however conductive electrodes are inserted into openings in the plates. The biasing system is connected to bias the workpiece as the cathode and the conductive electrodes as anodes. In this embodiment, the spacing between the anodes and the workpiece may be varied.

In other embodiments, the biasing system may be a pulsed DC bias voltage. A negative pulsed DC voltage is applied to have a duty cycle that is selected such that (1) when the voltage is "on," a negative voltage is applied to the workpiece such that positive source gas ions are attracted to the internal surfaces and react chemically to coat the internal surfaces of the workpiece, and (2) when the voltage is "off," the positive source gas ions are sufficiently replenished within the interior of the workpiece to provide uniformity in coating the internal surfaces. If the coating material is an insulator, the "off" condition of the duty cycle may include a reverse voltage that is sufficient to deplete surface charges resulting from the coating of the internal surfaces of the workpiece.

Where the workpiece includes at least two openings, conductive plates may be inserted at each opening to encompass the desired sectional length, with the conductive plates being physically and electrically isolated from the workpiece by seals.

In another embodiment of the invention, "flow-cycling" is used to further improve uniformity, or to increase the length of the section that may be coated, thus reducing total coating time. In this method, the gas supply and the pumping supply are coupled to both sectional plates and supplied with shutoff valves, so that gas can be either introduced or pumped out through either plate, as required. In a first coating cycle, gas is introduced through the "entrance" plate and is pumped out of the "exit" plate, and in a second cycle this flow is reversed in direction. The rate and the repetition of these cycles can be varied for different aspect ratio workpieces.

DETAILED DESCRIPTION

Figure 1:
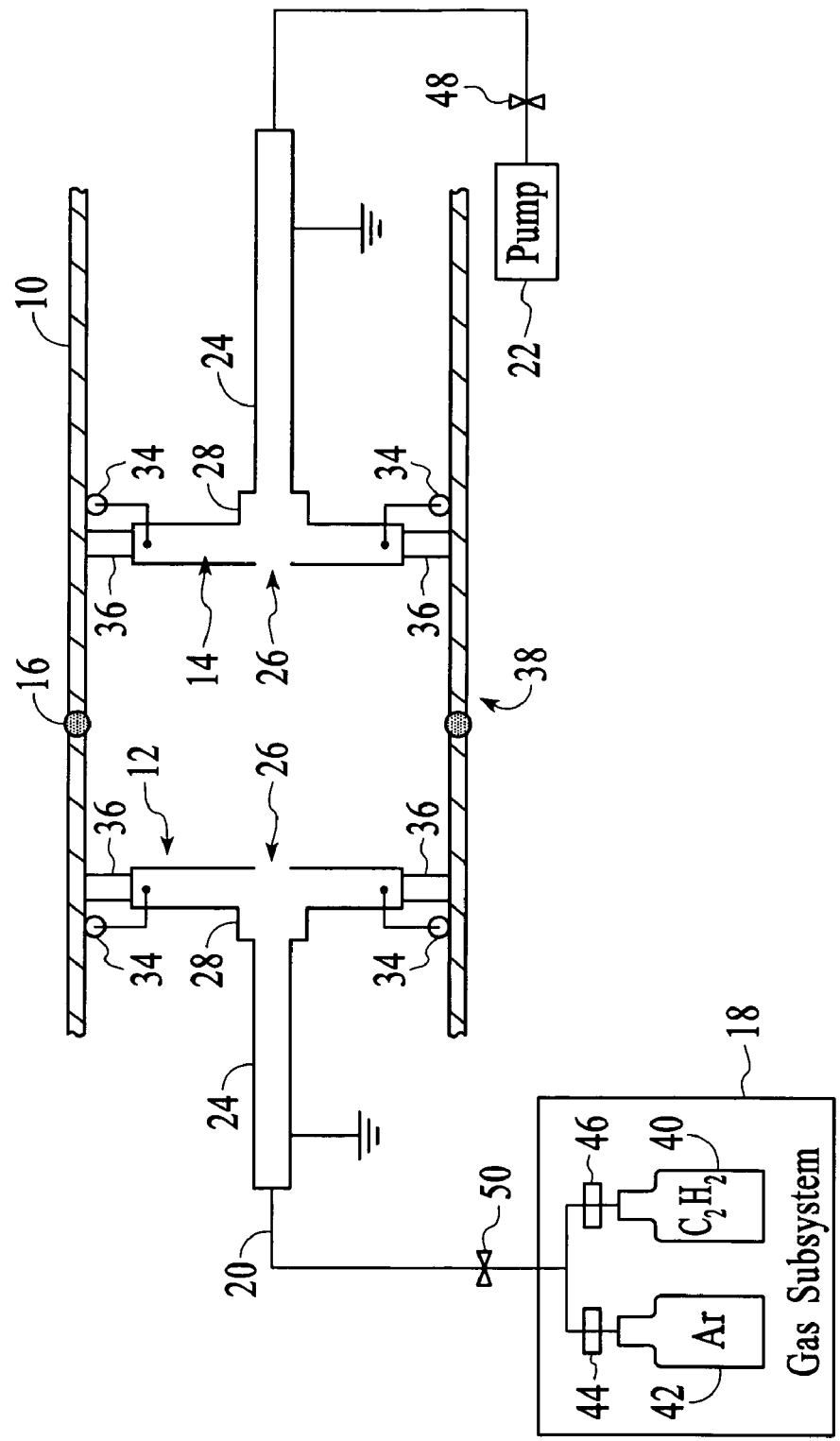
FIG. 1 is a functional view of a coating apparatus in accordance with one embodiment of the invention.

FIG. 1 shows a conductive workpiece 10 very long in length, for example having a length-to-diameter ratio greater than 50:1. The conductive workpiece may be an assembly of sections welded together to form long lengths of pipe, but may also be a single high aspect ratio piece. Often, sections of pipe, having already been coated and having a uniform coating, are welded together. The welds and the areas surrounding the welds, in which the welding process has compromised the coating, require corrosion-resistant coating.

The conductive structures 12 and 14 are inserted into workpiece openings (not shown) and maneuvered into position at or near weld 16. The conductive structure 12 is coupled to a gas supply subsystem 18 via flexible gas supply line 20. The conductive structure 14 is coupled to a pumping subsystem 22 via flexible pump lines 24. The gas supply and pump lines are connected to openings 26 (FIG. 2) by vacuum-tight fittings 28 by a means known in the art. The gas supply and pump lines are electrically isolated from the conductive structure by an insulator 30, also shown in FIG. 2. A readily available non-toxic carbon-containing gas, such as methane or acetylene, is provided by a first gas supply container 40. This gas is used to form a diamond-like carbon (DLC) coating on the inside of the workpiece 10. Argon (or other sputter gas) is provided from a second gas container 42 to allow a plasma "pre-cleaning" of the pipe surfaces, and mixing of Ar and the carbon containing gas.

Figure 2:
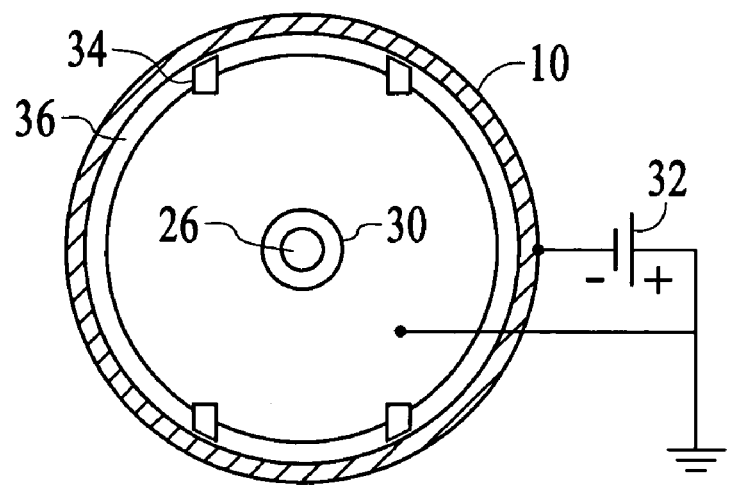
FIG. 2 is an end view of a conductive structure in accordance with the first embodiment

The conductive pipe or "workpiece" 10 is connected to a pulsed DC power supply 32, which applies a pulsed negative bias. This negative bias is used to (1) create a plasma between a cathode and an anode, (2) draw an ionized reactive gas to the surfaces to be coated, (3) allow ion bombardment of the film to improve film properties such as density and stress levels, and (4) allow control of uniformity by adjusting the duty cycle so as to permit replenishment of a source gas and depletion of surface charges resulting from the coating process during the "off" portion of the cycle. Here, the workpiece 10 functions as a cathode while the conductive structures 12 and 14 are connected to the positive side of the pulsed DC supply and biased as anodes. The conductive structures are mounted on insulated rollers 34. A retractable vacuum seal 36, as shown in FIG. 2, surrounds the conductive structures. The vacuum seal, when extended, electrically isolates the conductive structures (anodes) from the pipe and physically isolates a section 38 of pipe to be coated from the remainder of the pipe.

When the vacuum seal 36 is extended, a localized section 38 of the workpiece 10 is isolated from the remainder of the workpiece. The section is pumped to a low pressure by the pumping subsystem 22 and the DC pulsed power supply 32 is used to apply a negative bias to the pipe 10 such that it functions as a cathode. Even though the entire pipe 10 is biased as a cathode, a plasma will only be generated within the interior of the pipe (workpiece section 38) that resides between the conductive structures 12 and 14, because this is the only portion of the pipe interior that is at a low pressure and meets the spacing and pressure requirements for plasma ignition. Also, this section of pipe is the only area exposed to the reactant gases. Therefore, only the internal surfaces of the pipe section will be coated.

As shown in FIG. 1, a precursor gas is introduced through the opening 26 in the conductive structure 12 when the gas inlet valve 50 is opened. Mass flow controllers 44 and 46 control the amount of gas flowing into the workpiece section 38. This gas is ionized into a plasma by the applied voltage. Ions contained in the gas are pulled to the internal surfaces of the workpiece section 38 (cathode) to form a coating. Unused gas and by-products are exhausted away by the pump 22 through an opening 26 in the conductive structure 14. The flow rate of gas out of the workpiece section 38 is controlled by pump throttle valve 48, such that the amount of gas and pressure within the workpiece section can be independently controlled to further optimize the uniformity of the coating. After the coating process is completed, the workpiece section 38 is brought to atmospheric pressure. The retractable vacuum seal 36 is withdrawn and the conductive structures 12 and 14 are moved, utilizing the flexible lines 64 and insulated rollers 34, to the next section or weld to be coated.

In another embodiment, the DC pulsed power supply 32 would be replaced by an AC power source to generate a plasma. Introduction of the gas and control of the flow and pressure would be handled as previously described.

When considering the flow rates and pressures required through a workpiece 10 with a high aspect ratio (length-to-diameter), if the internal section is approximated to be a long circular tube with laminar flow, Poiseuille's equation can be used:

$$(Q/P_1-P_2)=(\pi r^4 P)/(8\eta l)$$

where Q is the throughput (pressure times the volumetric flow rate), r is the passageway radius, l is the passageway length, $\eta$ is the viscosity, $P_1$ is the pressure at the workpiece opening to the source gas, $P_2$ is the pressure at the workpiece to the exhaust or pump, and P is the average pressure $(P_1+P_2)/2$. In the equation d is raised to the fourth power, causing a significant decrease in Q and an increase in the pressure gradient $(P_1-P_2)$ as d becomes smaller. Increasing the length will have the same affect as decreasing r, but to a lesser degree.

Deposition rate is proportional to pressure. As the pressure becomes higher at the entrance of the workpiece 10, as compared to the exit and because throughput is limited, the uniformity of a coating will become progressively worse with increasing aspect ratios. This invention overcomes the problem of poor uniformity in coating of workpieces 10 with these high aspect ratios by coating smaller sections 38 of the workpiece 10 with an acceptable aspect ratio and pressure drop from entrance to exit. Section after section is coated until the entire workpiece 10 or pipe is coated.

Figure 4:
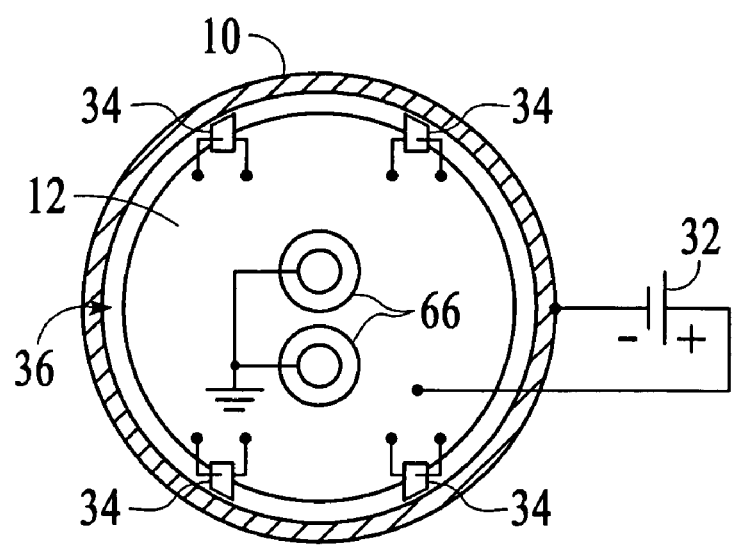
FIG. 4 shows an end view of a conductive structure in accordance with the second embodiment of the invention.
Figure 3:
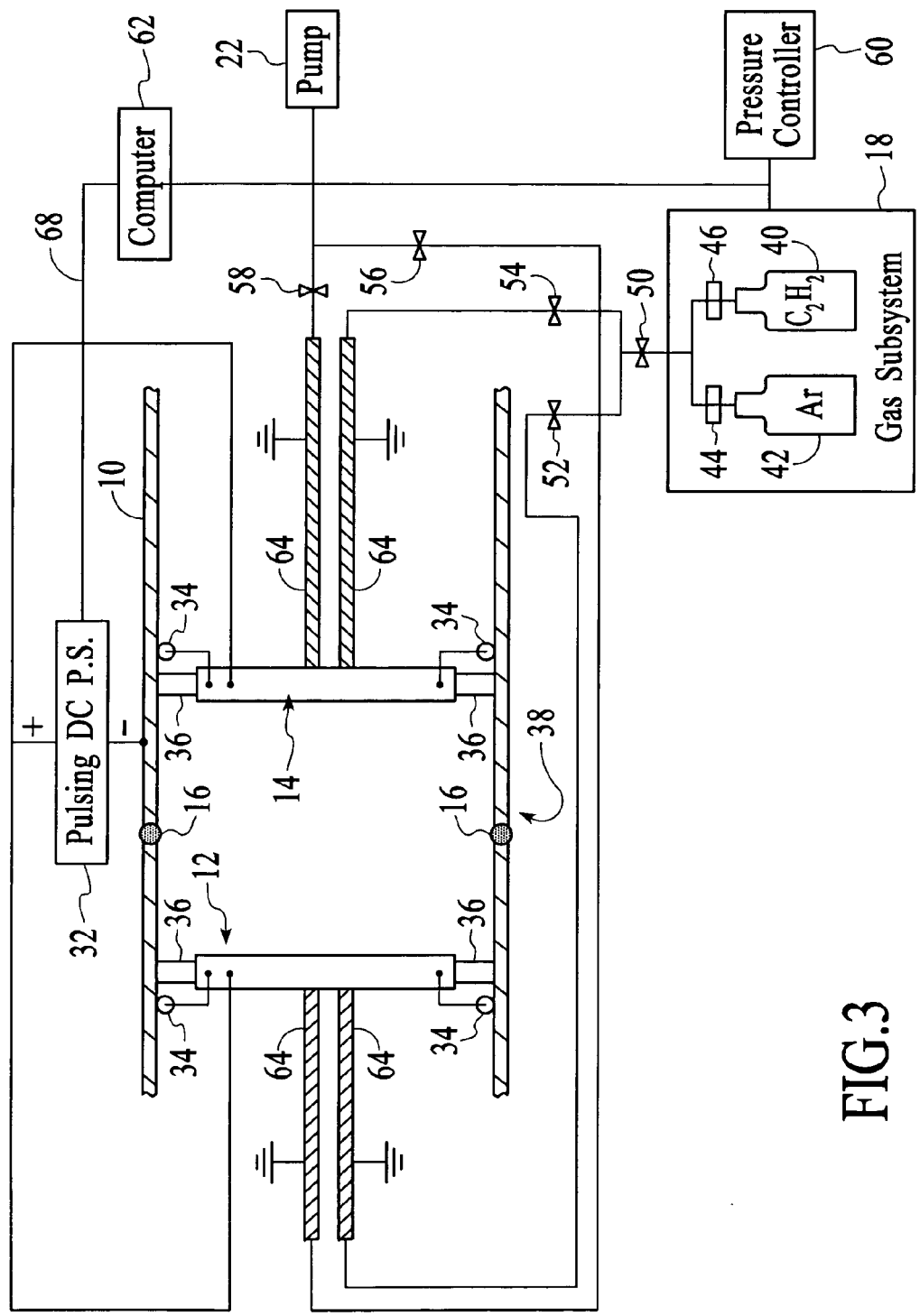
FIG. 3 is a functional view of a second embodiment of a coating apparatus in accordance with the invention.

In another embodiment, shown in FIG. 3, flow control valves 52, 54, 56 and 58 are utilized to implement a "flow-cycling" technique. In this embodiment, the conductive structures 12 and 14 are each coupled to both the gas supply and pump via flexible lines 64. The flexible lines are electrically isolated from the conductive structures by insulators 66, shown in FIG. 4. As in the previous embodiment, the workpiece 10 is biased as a cathode and the conductive structures are biased as anodes by pulsed DC power supply 32. The conductive structures are inserted into openings of the workpiece to form a workpiece section 38. The first flow cycle is implemented when flow control valves 52 and 58 are opened and flow control valves 54 and 56 are closed. Gas is introduced upon opening gas inlet valve 50. This first coating of the interior surfaces of the workpiece section 38 tends to be thicker toward the first conductive structure 12 and thinner toward the second conductive structure 14. Upon closing flow control valves 52 and 58 and opening flow control valves 54 and 56, the gas flow is reversed to implement a second coating cycle. During the second coating cycle, the coating will be thicker toward conductive structure 14 and thinner toward conductive structure 12, resulting in a uniform coating. In some applications, the first coating cycle and second coating cycle may be repeated in order to provide a more uniform coating over the entire length of the internal surfaces of a workpiece section 38.

Preferably, a pressure controller 60 is included to regulate certain parameters. The controller receives information from an optical probe and a langmuir probe (not shown), which are placed such that the optical probe has a line-of-sight into the plasma and the langmuir probe contacts the plasma. The two probes sense the plasma intensity and generate information indicative of the intensity level. The pressure controller uses this information to determine a proper setting level for flow control valves 56 and 58, which are adjustable. The settings should establish a condition within the workpiece section 38 such that the electron mean free path is slightly less than the inner diameter of the workpiece section, causing electron oscillation and increased ionizing collisions by the "hollow cathode" effect. Thus, a more intense plasma is generated within the workpiece section. Since the electron mean free path increases as the pressure decreases, it is necessary to decrease the pressure as the pipe diameter increases. For instance, a quarter inch (6.35 millimeter) diameter gas line will generate a hollow cathode plasma at a pressure of approximately 200 mTorr, while a four-inch (101.6 millimeter) pump exhaust duct would generate a plasma at approximately 12 mTorr. These are intended to be approximate values to show the general trend of lower pressures with larger diameters, but the pressure range can vary significantly from these values and still maintain a hollow cathode plasma.

In the case of a plasma-activated coating process and in particular when a hollow cathode plasma is generated, the plasma density depends on the pressure/diameter ratio. A typical prior art plasma density is a maximum of approximately $1E10$ ions/cm$^3$ or about 10% ionization (ionized gas/total gas particles ×100). By using a hollow cathode plasma, this technique can achieve plasma densities of up to $1E12$ ions/cm$^3$. This provides many advantages, including higher deposition rate, improved film quality, and a thin plasma sheath, such that ion energy is not lost due to collisions across the sheath.

If we assume a Child's law plasma sheath, s, for a planar diode structure: $s=0.4714 \times L_{De}(2V/T_e)$, where $L_{De}=\epsilon_0 T_e/en_i$) is the Debye length, $n_i$ is the electron and ion density, $T_e$ is the electron temperature in electron volts, $\epsilon_0$ is the permittivity of free space, e is the charge of an electron or $1.6E-19C$, and V is the bias voltage. For a typical plasma density of $1E10$ ions/cm$^3$ and $T_e=3eV$, with an applied bias of 1000V, s (standard density)=0.8 cm. Given the same parameters and a hollow cathode plasma density of $1E12$ ions/cm$^3$, s (hollow cathode)=0.08 cm. The mean free path, $\lambda$, of $N_2$ at typical PECVD pressure of 100 mTorr is approximately 0.5 cm, so that for a standard density plasma (since $\lambda<s$), ions will collide within the sheath and not arrive at the substrate with the full plasma energy, i.e., at approximately the applied bias voltage. But with a hollow cathode plasma, the sheath is collisionless. Thus, the hollow cathode technique is required for the PECVD process where accurate control of ion energy is required, such as DLC. Control of the pressure is also required throughout the workpiece for these types of processes, due to the effect of pressure on plasma density.

If there is a large pressure drop down the workpiece when a hollow cathode is utilized, the plasma density will change down the length of the pipe 10. This will affect not only deposition rate, but also film quality. For example, for the deposition of diamond-like carbon films, it is known that an ion energy of 100 eV gives a high diamond bonding (sp3) of the carbon. If an ion does not achieve this energy, it will form a graphite bond (sp2). If the pressure down the length of the tube drops by too large an amount, the plasma density will decrease toward the end of the tube (assuming the hollow cathode has been optimized for the pressure/diameter at the entrance of the tube) and the plasma sheath will become larger. When the plasma sheath becomes larger than the mean free path of the gas, the ions will lose energy due to collisions as they are accelerated across the sheath by the applied bias voltage. In this case, poor quality graphite-like film will be formed at the exit end of the tube and a high quality diamond-like film will be formed at the entrance. The sectional coating method eliminates this change in film quality by enabling selection of the length of tubing section to be coated so as to minimize the change in film quality due to change in hollow cathode plasma density which is caused by changes in pressure.

The degree of ionization or plasma intensity is important for the PIID technique to be effective, since it is only the ionized gas that is accelerated across the plasma sheath into the workpiece section 38. The hollow cathode effect provides a more intense plasma than otherwise available in DC or RF plasmas. The increase in intensity is available without the complications of other means of generating intense plasmas, such as magnet or microwave plasma sources. The process also eliminates the need for separate heating of the workpiece 10.

A computer software control 62 is shown as being connected to the gas supply subsystem 18 and the pressure controller 60. In addition, the computer software control is able to generate and transmit control signals via an interface cable 68 to the pulsed DC power supply 32 for the purpose of governing operations.

Figure 5:
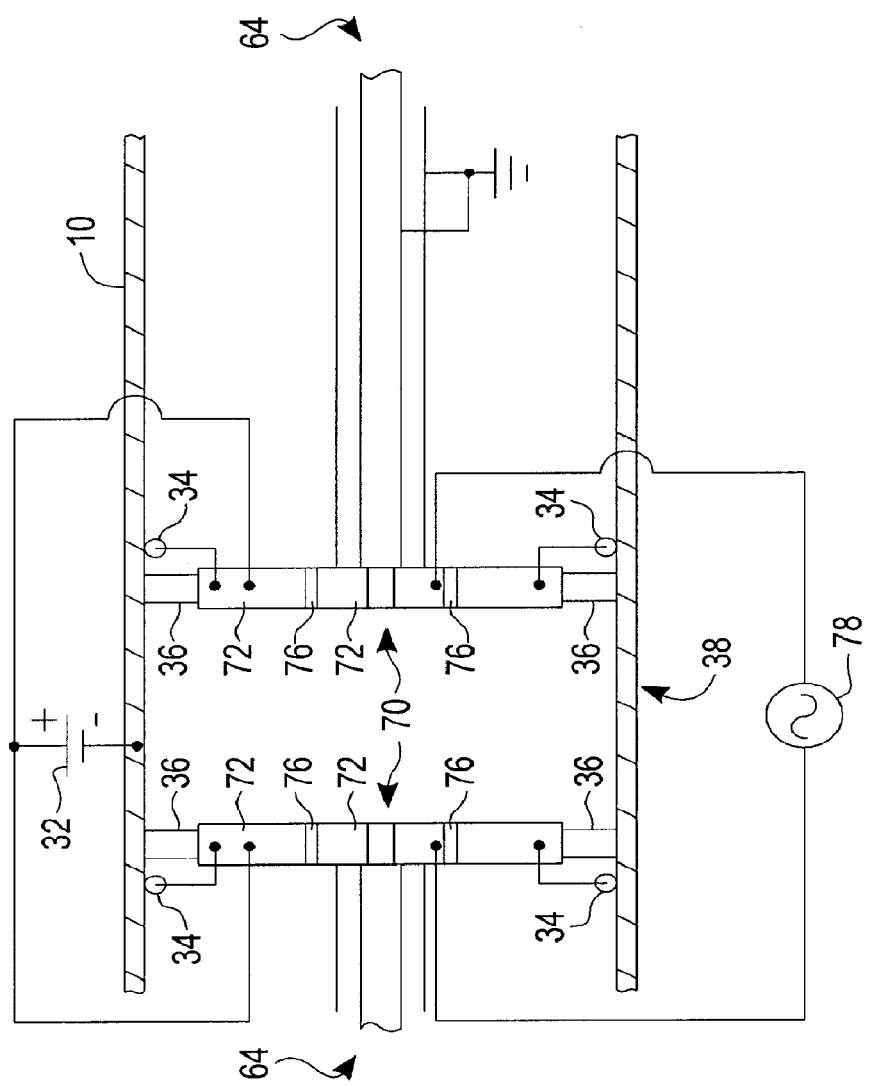
FIG. 5 is a functional view of a third embodiment of a coating apparatus in accordance with the invention.
Figure 6:
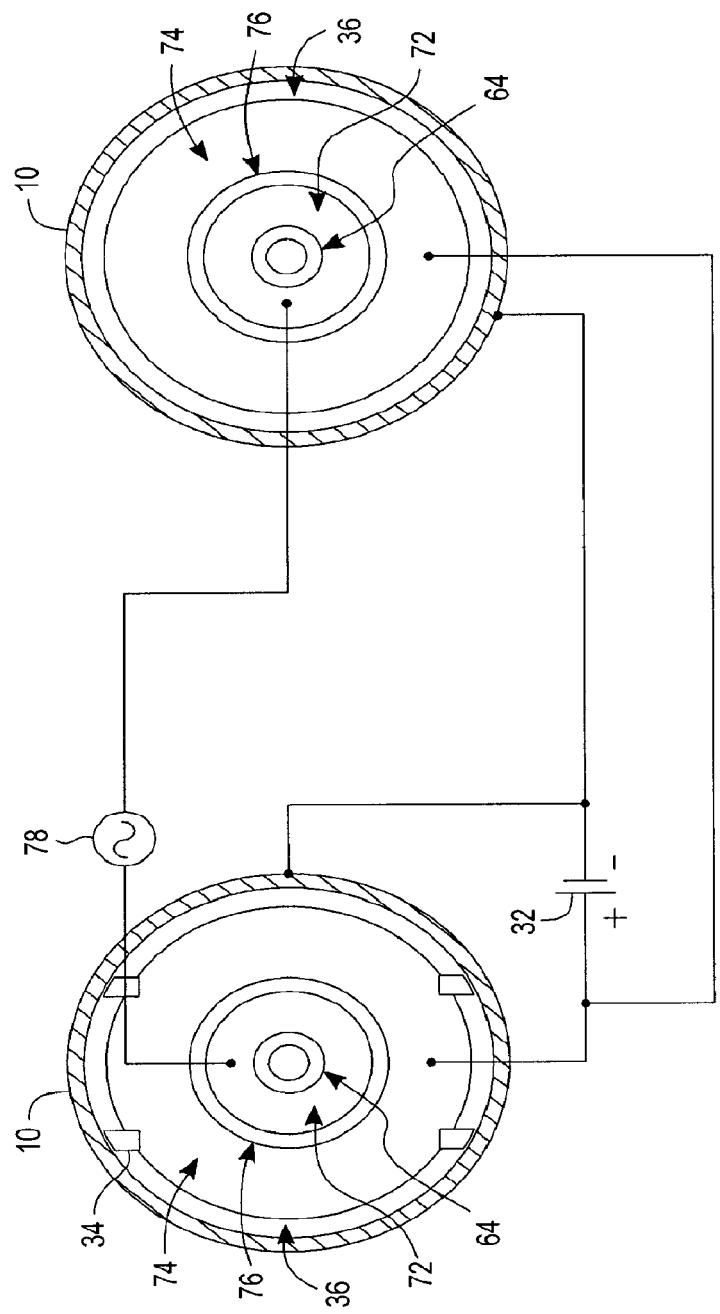
FIG. 6 shows an end view of an electrode structure in accordance with the fourth embodiment of the invention.

In a further embodiment, shown in FIGS. 5 and 6, electrode structures 70 have been inserted into workpiece 10 to form the workpiece section 38. The electrode structures are comprised of RF electrodes 72 and DC anodes 74. Flexible gas supply and vacuum supply lines 64 are also connected to the electrode structures. The RF electrodes and DC anodes are isolated from each other by annular insulator 76, which can be seen more clearly in FIG. 6. As in previous embodiments, a retractable seal 36 surrounds the electrode structure, separating it from the workpiece section.

In this embodiment, an RF voltage supply 78 is connected to RF electrodes 72, as shown in FIG. 6. DC anodes 74 are connected to the pulsed DC power supply 32. This arrangement provides a capability for generating and controlling a plasma within the workpiece section 38 by varying the power, bias amplitude and frequency of the RF voltage supply. An additional benefit is that for DC pulses with long "off" times, it is not necessary to re-ignite the plasma with each pulse, as it is maintained by the RF supply, although the high density hollow cathode plasma is generated by the DC pulse. This method could also be implemented using other frequencies of bias between electrodes 72, such as a pulsed DC or lower frequency AC signals. It can also be implemented biasing only the electrodes 72, with no bias applied to the part. This provides a simple method of generating an internal plasma for coatings that do not require the ion bombardment provided by biasing the substrate. Movement of the electrode structures is implemented as described in the previous embodiments.

Figure 7:
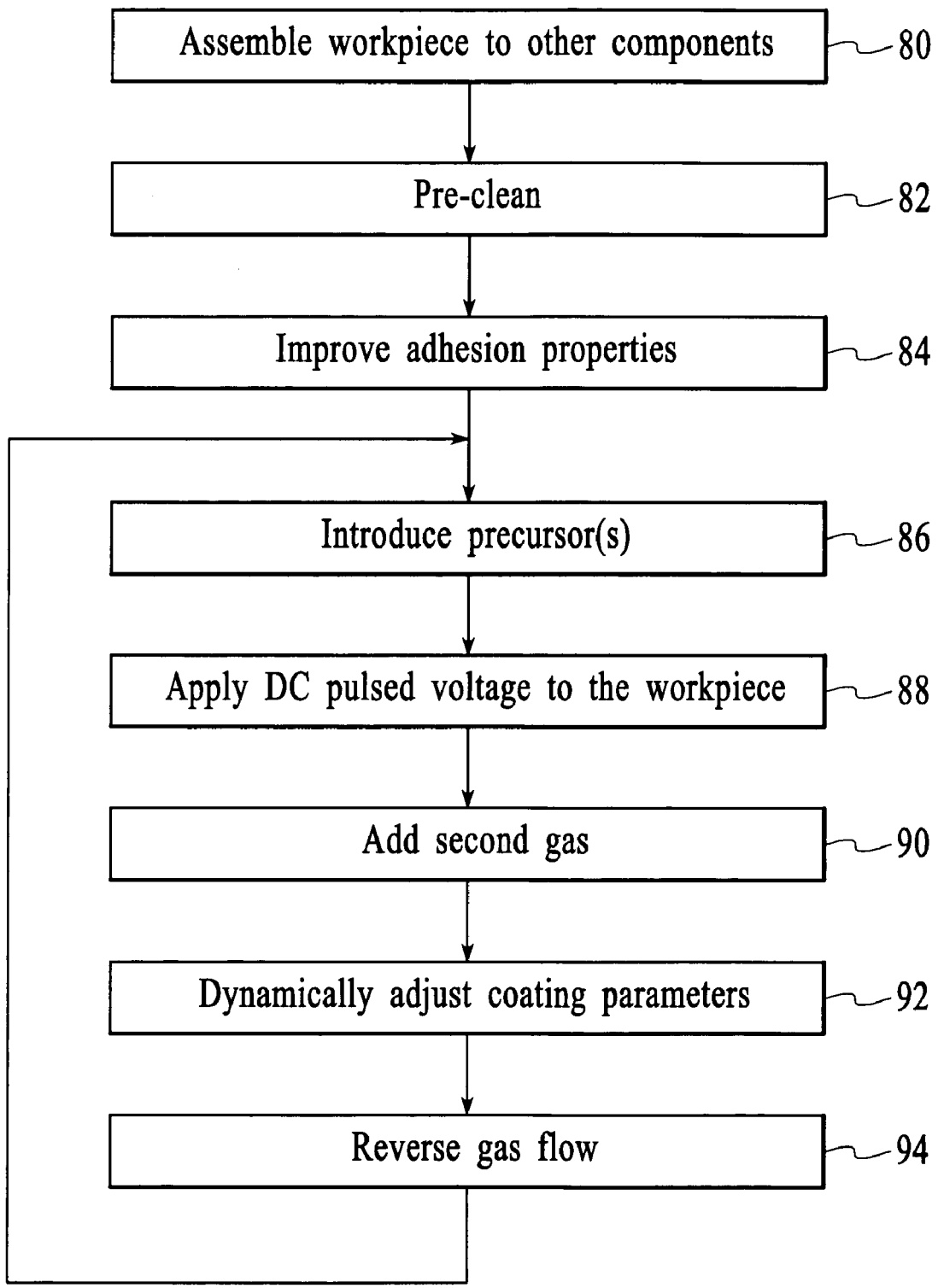
FIG. 7 shows a process flow of steps for implementing the invention.

One embodiment of the process flow in accordance with the invention will be described with reference to FIGS. 2 and 7. At step 80, the workpiece 10 is assembled to other components of a tubing system, so that it is not necessary to heat the workpiece following the completion of the interior coating process. Thus, all welding steps involving the workpiece are completed to apply a coating to the interior of the workpiece section 38. As previously noted, the workpiece is shown as an assembly of tubes or parts, but may be a unitary section.

At step 82, the conductive structures 12 and 14 are positioned at the first welded section. A pre-cleaning may be an introduction of a sputtering gas, such as argon, from the first gas supply container 42. The pre-cleaning may be initiated after pump down to $1 \times 10^{-3}$ Torr or, preferentially, below $1 \times 10$ Torr. Contaminants on the interior surface of the workpiece are sputtered off when a negative DC pulse is applied via the power supply 32.

An optional step 84 of implanting carbon may be used in some applications. Carbon implantation forms a subsurface carbon layer in the workpiece section 38 material, which may be stainless steel. This layer improves the adhesion to DLC and other materials. Carbon implantation is provided at a higher magnitude bias than experienced at other steps in the coating process. A suitable bias is one that exceeds 5 kV. Care must be taken at this step for smaller diameter tubes, so that the size of the plasma sheath does not become larger than the radius of the workpiece section 38.

Alternatively, in step 84 a silicon-containing precursor such as silane mixed with methane or tetramethylsilane can be introduced to form a silicon-containing DLC adhesion layer between a metal substrate (workpiece section 38) and the pure DLC coating. This layer will form a strong metal-silicide bond with the substrate and a strong silicon-carbide bond with the DLC coating, providing strong adhesive forces for the coating. The high bias voltage necessary for carbon implantation is not required. A bias voltage of approximately 1 kV would be sufficient.

Following the optional implantation step 84, at least one precursor is introduced into the workpiece section 38 at step 86. Acceptable precursors include methane, acetylene or toluene. The DC pulsed voltage is reduced in this process step in order to provide thin film deposition, rather than implantation. The application of a DC pulsed voltage is represented by step 88 in FIG. 7. During the coating step, argon may be mixed with the carbon-containing precursors, as indicated at step 90.

In step 92, the coating parameters are dynamically adjusted during the coating process. Probes provide information that can be used by the computer software control 62 and the pressure controller 60 to maintain various parameters within their ranges of tolerance. Thus, the factors that determine pressure within the workpiece section 38 can be adjusted as needed or the magnitude and duty cycle of the pulsed bias may be adjusted, if necessary.

Upon completion of the first duty cycle, reverse flow cycling is implemented in step 94. Process flow steps 80-94 may be repeated to ensure that the internal surfaces of the workpiece sections 38 of different diameters and lengths are coated uniformly. After the completion of the coating process, the conductive structures are repositioned at the next section.

In principle, any metal, ceramic or DLC coating can be applied that has the desired properties of hardness and corrosion resistance (e.g., TiN, CrN, etc). However, for coatings applied in the field, a non-toxic gas is employed. A DLC precursor such as methane, acetylene or toluene is used as the source gas in the preferred embodiment. DLC has been shown to provide a hard, corrosion resistant, and low friction coating. Properties of this film can be tailored by adjusting the sp3 (diamond), sp2 (graphite) and sp1 (linear) bonding hybridization ratios in the film. Hydrogen content will also affect the film properties. Typically, the highest sp3 ratio (most diamond-like) is obtained by methane, but this also produces a lower deposition rate compared to higher carbon molecules and also higher compressive stress, limiting film thickness to 5000 Å. Acetylene can also provide high sp3 content with a higher deposition rate compared to methane but the bias voltage should be increased to compensate for the larger molecule size. The addition of certain dopants (e.g., silicon or silicon oxide) to the DLC matrix will improve thermal stability and can reduce compressive stress. An organic-based precursor, such as hexemethyeldisiloxane ($C_6H_{10}Si_2O$) can be mixed with the hydrocarbon precursor(s) to introduce these dopants.

Film properties can thus be tailored by selection of the precursor gas, or layered films can be deposited. For example, if it is necessary for a process (e.g., very rough welds) to have a thick deposited coating, the above process can be modified by deposition of a thin methane-based layer, followed by the use of a higher deposition rate, lower stress precursors such as toluene, or by higher energy ion bombardment to increase adhesion and reduce stress. The trade-offs of desired mechanical, electrical or optical film properties and deposition rate and stress for given precursors and bonding hybridizations can be optimized for a given process.

An advantage of the process is that the previously mentioned ion bombardment benefits of the PIID method can be used to improve film adhesion and density. This is accomplished in the preferred embodiment by applying a negative pulsed DC bias to the workpiece section 38 with respect to the anodes on the conductive structures 12 and 14. Since the DLC coating is an insulator, short pulses are used (1-20 microseconds) to prevent excessive building of positive charges on the coating. The charge is compensated when the plasma sheath collapses during the off cycle. The coating surface is bombarded by energetic positive ions created by the hollow cathode within the workpiece section. The energy of the ions can be controlled by the magnitude of the applied voltage and by the pressure (higher pressure causing more collisions, resulting in lower energy for a given voltage).

A further advantage is that the multi-step process can be used to tailor film qualities deposited on the internal surface of the workpiece section 38. The surface of the workpiece section can also be pre-cleaned by the introduction of a sputtering gas such as Ar in the first step of the method, following pump down to $1 \times 10^{-3}$ Torr. Contaminants on the interior surface of the workpiece section are sputtered off when the negative DC pulse is applied. A second step can be performed using carbon implantation to form a subsurface carbon layer in the steel. This layer improves the adhesion of the DLC. This is done by increasing the magnitude of the bias to greater than 5 kV. Care must be taken at this step for small diameter tubes, so that the size of the plasma sheath does not become larger than the radius tube. The formula for the smallest radius of a cylinder for which the sheaths do not overlap is as follows:

$$d = \sqrt{\frac{4\varepsilon V}{en}}$$

where V is the magnitude of the voltage, and n is the plasma density. An alternative method of forming an adhesion layer to a workpiece section 38 is to deposit a material that will form a strong bond to both the workpiece section and the coating. In the case of a metal workpiece section and a DLC coating, the adhesion layer can be a silicon-containing DLC layer, which can be attained by introducing a silicon-containing precursor such as tetramethylsilane. In this case, the high bias voltages required for carbon implantation are not necessary.

Following the implantation step, DLC deposition steps are performed using the above-mentioned, methane, acetylene or toluene precursors. The DC pulsed voltage is reduced in this process step to provide thin film deposition instead of implantation (e.g., 100V-10 kV). Argon is also mixed with the carbon-containing precursors during these coating steps. Uniformity is also controlled by the duty cycle of the DC pulse, such that when the pulse is off, the source gas is allowed to replenish with in the workpiece section. One skilled in the art will recognize that uniformity is also controlled by the selections of the gas flow rate and pumping speed.

What is claimed is:

1. A system for uniformly coating the internal surfaces of a section of a conductive workpiece comprising:
   first and second members configured for insertion into said section of said workpiece and dimensioned to isolate a localized interior section of said workpiece there between, said localized interior section being a cross sectional region of section into which said first and second members are inserted;
   wherein said first and second members include a sealing means for physically and electrically isolating said conductive workpiece from said first and second members and for sealing said localized interior section from a remainder of said section of said workpiece;
   a biasing system connected to said first and second members such that said first and second members are at a same voltage, said biasing system being connected to said workpiece such that said workpiece functions as a counter-electrode to said first and second members;
   a gas source inlet connected to one of the said first and second members for flowing a gas containing a coating material into said localized interior section of said workpiece such that exposure of said workpiece to said gas is limited to said localized interior section;
   a vacuum source outlet connected to the other of said first and second members for evacuating said gas from said localized interior section; and
   a means for varying the position of said first and second members along a length of said workpiece.

2. The system of claim 1 wherein said biasing system applies a DC bias voltage to said first and second members.

3. The system of claim 1 wherein said biasing system applies an AC bias voltage.

4. The system of claim 1 wherein said biasing system is connected such that said conductive workpiece functions as a cathode and said first and second members function as anodes, said biasing system applying a DC voltage bias, said DC voltage bias establishing ion bombardment energy sufficient to coat said internal surfaces within said localized interior section.

5. The system of claim 4 wherein said DC voltage bias includes a negative pulsed DC bias voltage.

6. The system of claim 1 wherein said first and second members are electrode structures inserted into a first opening and a second opening of said conductive workpiece.

7. The system of claim 1 wherein regulation of said localized interior section is related to an interior diameter of said conductive workpiece so as to maintain a condition in which said plasma intensity within said localized interior section is adjustable via variations of said biasing system, wherein said condition establishes a hollow cathode effect.

8. A method of modifying internal surfaces of a localized area of a conductive workpiece comprising:
   creating an interior environment within said workpiece supportive of said modifying of said internal surfaces, including reducing pressure within said workpiece by using a vacuum source;
   positioning a gas release structure having first and second members into an opening to a section of said workpiece, said first and second members being configured and dimensioned to isolate a localized interior section of said workpiece by providing a seal between the workpiece and first and second members, said localized interior section being a cross sectional region of said section of said workpiece, said gas-release structure being coupled to a gas source and being variable in position along a length of said workpiece;
   coupling a biasing system to said first and second members and to said workpiece such that said first and second members are at a same voltage and such that said workpiece functions as a counter-electrode to said first and second members;
   introducing a gas containing coating material into said localized interior section of said workpiece via said gas-release structure having gas inlet in one member and gas exhaust in the other member such that exposure of said workpiece to said gas is limited to said localized interior section; and
   varying the position of said first and second members along said length of said workpiece.

9. The method of claim 8 further comprising connecting said biasing system to said first and second members to provide electrical conditions consistent with modifying said internal surfaces.

10. The method of claim 9 wherein connecting said biasing system includes providing a DC bias voltage.

11. The method of claim 9 wherein connecting said biasing system includes providing an AC bias voltage.

12. The method of claim 8 further comprising varying the positions of said first and second members along said length of said workpiece, said varying being consistent with repositioning of said gas-release structure along said length of said workpiece.

13. The method of claim 8 further comprising connecting said biasing system such that said workpiece functions as a cathode and said first and second members function as anodes, said biasing system providing a DC voltage bias, said DC voltage bias establishing ion bombardment energy sufficient to modify said internal surfaces of said conductive workpiece.

14. The method of claim 13 wherein connecting said biasing system includes providing a negative pulsed DC bias voltage to said workpiece.

15. A system for uniformly coating the internal surfaces of a section of a conductive workpiece comprising:
   first and second members configured for insertion into said workpiece to define a localized interior section of said workpiece there between, each of said first and second members having a correspondence with a first electrode and a second electrode;
   wherein said first and second members include a sealing means for physically and electrically isolating said conductive workpiece from said first and second members and for sealing said localized interior section from a remainder of said section of said workpiece;

a biasing system connected to said first electrodes to provide a DC bias voltage so as to establish ion bombardment energy sufficient to modify said internal surfaces of said localized interior section of said workpiece, said biasing system further being connected to said second electrodes to provide an AC voltage bias sufficient to support a plasma within said localized interior section;

a gas source inlet connected to one of the said first and second members for flowing a gas containing a coating material into said localized interior section of said workpiece;

a vacuum source outlet connected to the other of said first and second members for evacuating said gas from said localized interior section; and a means for varying the position of said first and second members along a length of said workpiece.

16. The system of claim 15 wherein said biasing system is connected to said workpiece to provide a counter-electrode with respect to said first electrodes.

* * * * *